United States Patent [19]
Bennet et al.

[11] Patent Number: 5,671,161
[45] Date of Patent: Sep. 23, 1997

[54] SWITCH WITH DIAGNOSTIC CAPABILITY

[75] Inventors: Ronika A. Bennet, Freeport; Jeffrey S. Hall, Rockford; Perry A. Holman, Jr.; Lyle D. Johnsen, both of Freeport, all of Ill.; Matthew D. Kirkwood, Monroe, Wis.

[73] Assignee: Honeywell Inc., Minneapolis, Minn.

[21] Appl. No.: 574,803

[22] Filed: Dec. 19, 1995

[51] Int. Cl.⁶ .................................................. H01L 43/06
[52] U.S. Cl. ...................... 364/560; 73/514.31; 327/511; 335/2; 335/17; 335/32
[58] Field of Search .................. 364/560; 335/2, 335/17, 32; 73/514.31; 324/207.2; 327/511; 340/644, 635; 200/19 M, 61.4, 61.45 M, 81.9 M, 83 L

[56] References Cited

U.S. PATENT DOCUMENTS

| | | | |
|---|---|---|---|
| 5,004,871 | 4/1991 | Purcell | 178/18 |
| 5,239,691 | 8/1993 | Retzer et al. | 455/89 |
| 5,373,125 | 12/1994 | Ford et al. | 200/61.52 |
| 5,420,571 | 5/1995 | Coleman et al. | 340/644 |
| 5,534,849 | 7/1996 | McDonald et al. | 340/517 |

*Primary Examiner*—Emanuel T. Voeltz
*Assistant Examiner*—Patrick Assouad
*Attorney, Agent, or Firm*—William D. Lanyi; John G. Shudy, Jr.

[57] ABSTRACT

A switch is provided with the ability to diagnose its own operation and provide signals that represent the actuation of the switch and various diagnostic outputs that indicate fault conditions or potential fault conditions with regard to either the switch or related machinery. A magnetically sensitive component, such as a Hall element, is used to provide an analog output signal that is representative of the position of an actuator to which a magnet structure is rigidly attached. As the actuator moves in response to an external force, the magnet structure moves with respect to a stationary magnetically sensitive component. The analog output from the magnetically sensitive component can be used to determine the position of the switch. Based on this information, a microprocessor provides a binary output signal indicating whether the switch is actuated or deactuated. In addition, the movement of the actuator can be compared to various thresholds to determine the operate point, the overtravel point, the total travel and the velocity of the switch plunger.

19 Claims, 13 Drawing Sheets

SWITCH WITH DIAGNOSTIC CAPABILITY

BACKGROUND OF THE INVENTION

1. Field of the Invention

The present invention is generally related to a switch, such as a limit switch, which is provided with a movable magnet structure attached to a plunger and a stationary magnetically sensitive component, such as a Hall element, that provides an output signal which is responsive to the position of the plunger and which is analyzed by a microprocessor to determine the proper operating characteristics of the switch.

2. Description of the Prior Art

Many different types of switches are known to those skilled in the art. Some switches are provided with a movable plunger and a binary means for determining the position of the plunger. In certain applications, many switches can be connected in signal communication with a communication bus. In applications of this type, the switches typically provide binary signals to a centralized controller such as a programmable logic controller.

In recent years, various types of intelligent switches have been developed that are provided with the capability of performing certain diagnostic functions. For example, U.S. Pat. No. 5,420,571, which issued to Coleman et al on May 30, 1995, discloses a switch that has the capability of predicting its end of useful operation. A monitoring device is provided for use in association with a limit switch or similar mechanically actuated device in order to permit its end of life to be predicted. The system uses nonvolatile random access memory to store a count which represents the number of occurrences of one of two alternative events. The first event is the occurrence of a number of switch actuations and the second event is the lapse of a predetermined period of time. When either of these two events occurs, a microprocessor increments a count in the nonvolatile memory unit and clears both the clock and the volatile memory parameter. When the number stored in the nonvolatile memory represents a number of actuatations estimated to be approximately equal to the total life of the switch, this condition can be signaled to a sensor bus by a communication circuit. Alternatively, a light emitting diode can be alternately energized and deenergized to represent the number of actuations having exceeded the predicted end of life.

Certain types of switches can utilize a movable magnet structure in combination with a stationary magnetically sensitive component, such as a Hall element, to determine the movement of an internal component such as a cantilever beam. U.S. patent application Ser. No. 08/423,196 which was filed on Apr. 18, 1995 by Figi et al, discloses an accelerometer with a cantilever beam formed as part of the housing structure. The accelerometer is provided with a magnet structure encapsulated within a distal end of a cantilever beam that is formed as an integral part of a housing structure. The cantilever beam, the distal end and the housing structure are formed of a nonmagnetic material, such as plastic, during a single injection molding procedure. The magnetic structure within the distal end of the cantilever beam can comprise two magnets associated with a pole piece and disposed within an opening that is formed in a nonmagnetic bracket. Although many types of magnet structures are possible within the scope of this component, a particularly preferred magnet structure comprises two magnets that are arranged in opposite polarity with the opposite poles of the two magnets being located adjacent to each other on opposite sides of a centerline. The magnet structure can be held in place during the injection molding process by the magnetic attraction between the magnet structure and a ferromagnetic portion of the mold. The magnetically sensitive component, which is held in place within a wall of the housing structure, can be a Hall effect element.

Certain switches that are known to those skilled in the art use a plunger that is provided with a magnet structure attached thereto. When the switch, such as a limit switch, is actuated, the magnet structure moves relative to the stationary position of the magnetically sensitive component. The magnetically sensitive component provides an output signal that represents the position of the plunger. Switches of this type are the XL Series or VX Series switches which are available in commercial quantities from the MICRO SWITCH Division of Honeywell Incorporated. This particular switch uses a digital Hall element that provides a binary signal representing the position of the plunger relative to a predetermined reference point. When the plunger moves a sufficient distance to cause the magnet structure to pass the reference point, a logical high signal is provided as an output from the switch. At all other times, a logical low signal is provided as the output of the switch. This type of two-state device has been used in industry for many years.

Switches that are known to those skilled in the art can fail in several ways. For example, one of the electrical connections within the switch can break to create an open circuit condition. Also, the plunger of the switch can fail to return to a rest position because of a mechanical failure within the structure of the switch. Certain types of failures can also occur because of problems that might exist with the associated machinery on which the switch is attached. For example, if the limit switch is used to determine the movement of a machine component, the movement of the machine component can change slightly so that it does not completely depress the plunger of the limit switch. It would therefore be significantly beneficial if a limit switch could be provided with the appropriate intelligence to diagnose its own operation and the operation of related equipment so that failure of the switch or the related equipment can be immediately diagnosed and corrected. In certain situations, an intelligent switch of this type can also predict the imminent failure of the switch or associated equipment prior to its actual occurrence.

SUMMARY OF THE INVENTION

The present invention provides a switch that has a housing structure and an actuator that is movable relative to the housing structure in response to an external force exerted upon the plunger. A magnet structure is attached to the actuator and is movable along a path within the housing structure in response to movement of the actuator. In certain embodiments of the present invention, the actuator is a plunger that is slideably associated with the housing structure in a way that permits an external force to cause the plunger to move into and out of the housing structure by a preselected magnitude.

In a preferred embodiment of the present invention, a magnetically sensitive component is attached to the housing structure and disposed proximate the path of the magnet structure. The magnetically sensitive component provides an analog output signal which is representative of the position of the magnet structure along the path. The present invention also comprises a means for determining the position of the actuator relative to the housing structure as a function of the analog output signal provided by the magnetically sensitive component, such as a Hall effect element. The present invention also comprises a means for determining the magnitude of movement of the actuator relative to a predetermined position.

In a particularly preferred embodiment of the present invention, it also comprises a means for providing a binary output signal that is representative of the position of the actuator relative to the housing structure. A preferred embodiment also comprises a means for calculating the velocity of the actuator when the magnet structure moves along the path described above. It can also comprise a means for counting the number of actuations of the actuator in response to the external force exerted on the plunger. The present invention can comprise a means for comparing the analog output signal from the magnetically sensitive component to a predetermined range of magnitudes in order to determine the proper operation of the switch.

The magnetically sensitive component can comprise a Hall effect element or a magnetoresistive component and the magnet structure can comprise two permanent magnets that are disposed in abutting association with each other. A microprocessor can be disposed within the housing structure for providing the means for determining the position of the actuator relative to the housing structure as a function of the analog output signal. In addition, the microprocessor can provide the means for determining the magnitude of movement of the actuator relative to the predetermined position. In certain embodiment of the present invention, the microprocessor can also provide the means for providing the binary output signal that is representative of the position of the actuator relative to the housing structure and, in addition, it can provide the means for calculating the velocity of the actuator when the magnet structure moves along the path. The microprocessor can also provide the means for counting the number of actuations of the actuator in response to the external force and, in addition, the means for comparing the analog output signal from the magnetically sensitive component to a predetermined range of magnitudes to determine the proper operation of the switch.

BRIEF DESCRIPTION OF THE DRAWINGS

The present invention will be more fully and clearly understood from a reading of the Description of the Preferred Embodiment in conjunction with the drawings, in which.

DESCRIPTION OF THE PREFERRED EMBODIMENT

Figure 1A:
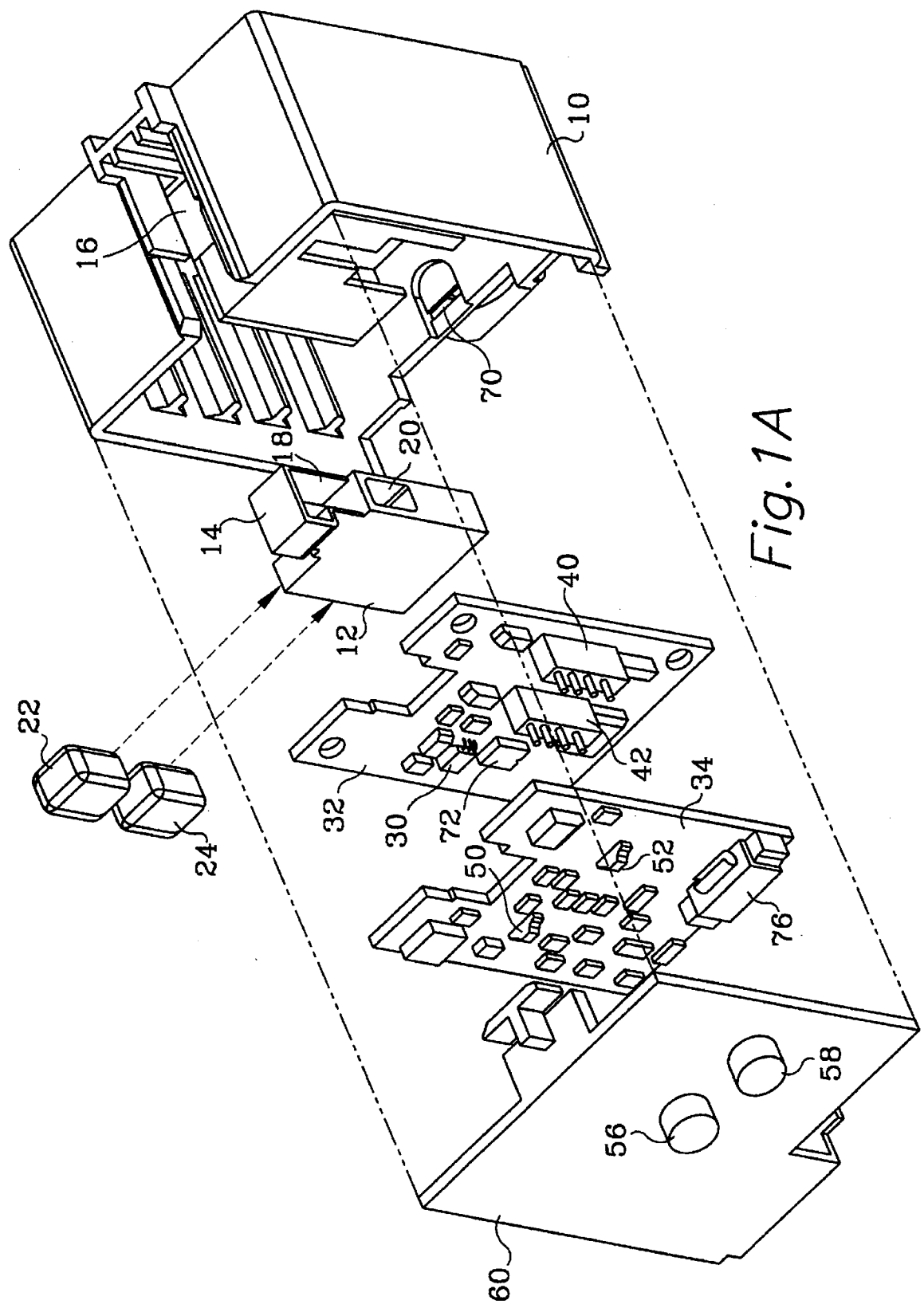
FIG. 1A is an exploded perspective view of a switch made in accordance with the present invention.

Throughout the Description of the Preferred Embodiment, like components will be identified by like reference numerals.

FIG. 1A shows an exploded perspective view of the present invention. A housing structure 10 is shaped to receive an actuator 12 in sliding association therein. The lower portion of the actuator 12 in FIG. 1A is disposed within the housing structure 10 and the upper portion 14 of the actuator 12 extends through a slot 16 of the housing structure 10 to permit an external force to be exerted upon it. Throughout the Description of the Preferred Embodiment of the present invention, the actuator 12 will also be referred to as a plunger. The cavities in the actuator 12 that are identified by reference numerals 18 and 20 are provided for the purpose of reducing the mass of the plunger. Although not shown in FIG. 1A, the actuator 12 also has other openings which are shaped to receive a first magnet 22 and a second magnet 24. In combination with each other, these two magnets provide a magnet structure that moves with the actuator 12 when it is depressed relative to the housing structure 10.

A Hall effect element 30 is attached to a lower circuit board 32 which is disposed within the housing structure 10. In addition, an upper circuit board 34 is disposed within the housing structure 10. A first interconnection block 40 and a second interconnection block 42 provide the appropriate electrical interconnects between the lower board 32 and the upper board 34. The upper board 34 is provided with two light emitting diodes, 50 and 52, which provide visual output signals through light pipes 56 and 58 formed in a cover 60. Although not shown in FIG. 1A, the cover 60 is provided with a protrusion 90 that snaps into an opening 70 to attach the cover 60 to the housing structure 10.

When the actuator 12 moves relative to the housing structure 10 in response to an external force, the magnet structure moves relative to the Hall effect element 30. This movement of the magnet structure causes the Hall effect element 30 to provide an analog output signal that is representative of the position of the magnet structure and, in turn, the position of the actuator 12. It should be understood that numerous components attached to the lower circuit board 32 and the upper circuit board 34 provide the circuitry to allow the present invention to analyze the analog output signal from the Hall effect element 30. All of these individual components will not be described herein. However, it will be helpful if certain of these components are identified for reference during the following description of the preferred embodiment. An analog-to-digital converter 72 is provided to convert the analog output signal from the Hall effect element 30 so that it can be analyzed by a microprocessor 31 which is attached to the underside of upper board 34 and disposed between the lower board 32 and the upper board 34. The microprocessor 31 is not visible in the illustration of FIG. 1A. A connector 76 is provided on the upper board 34 to permit the switch to be connected in electrical communication with external components so that the switch can provide signals, to those external components, which are representative of the condition of the switch. In addition, the actuator 12 is provided with a cylindrical opening 98 in its bottom surface to receive a spring that returns the actuator 12 to a rest position when the external force is removed. The cylindrical opening 98 is not shown in FIG. 1A.

Figure 1B:
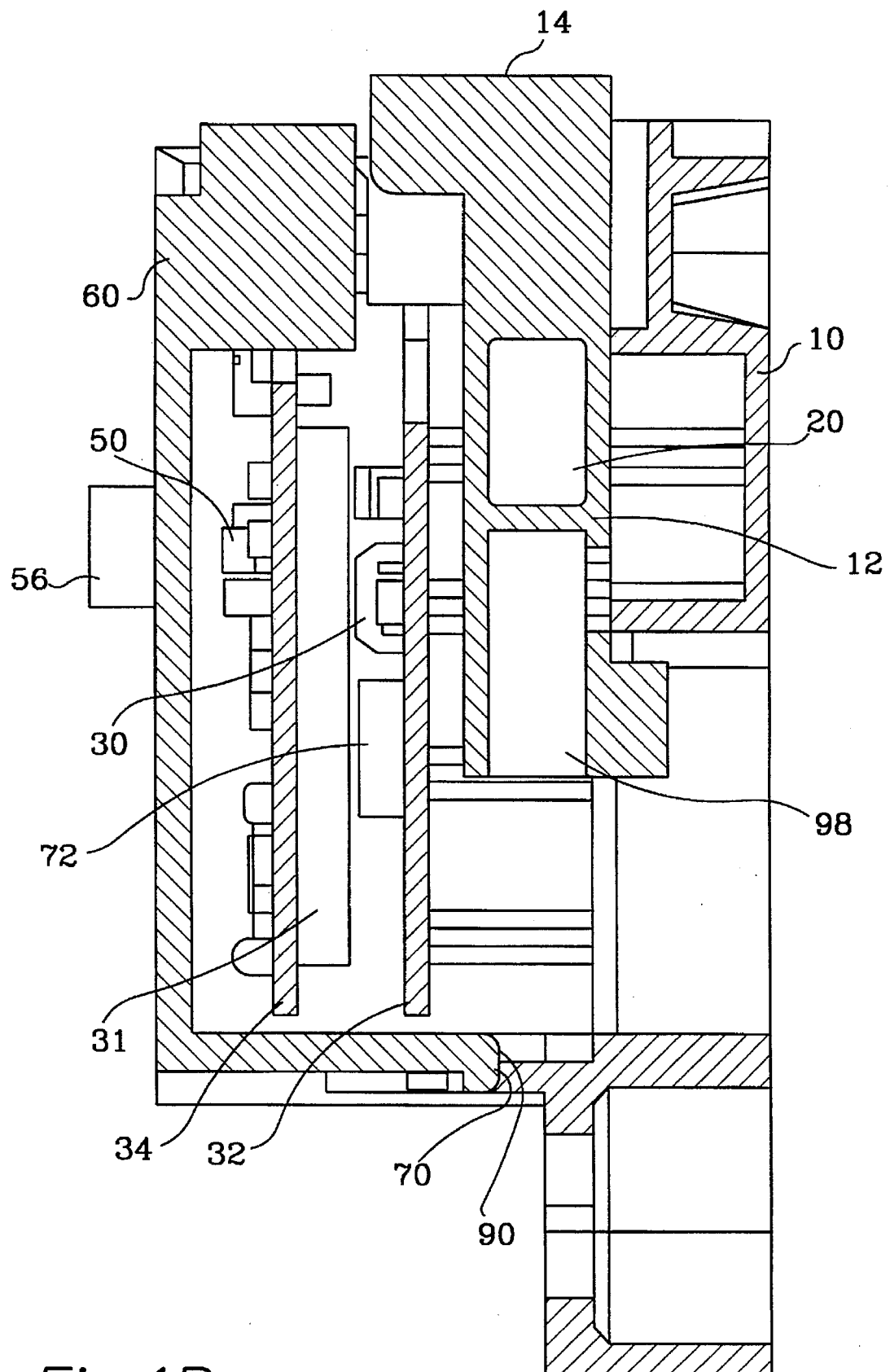
FIG. 1B is a section view of a switch made in accordance with the present invention.

FIG. 1B is a section view of the switch illustrated in FIG. 1A. In FIG. 1B, the actuator 12 is shown disposed within the housing structure 10 with its upper portion 14 extending slightly above the upper surface of the housing structure. The protrusion 90 on the cover 60 is shown disposed in the opening 70 to lock the cover 60 in position relative to the housing structure 10. Certain components on the lower board 32 and the upper board 34 are identified by their respective reference numerals in order to facilitate comparison of FIGS. 1A and 1B.

Figure 1C:
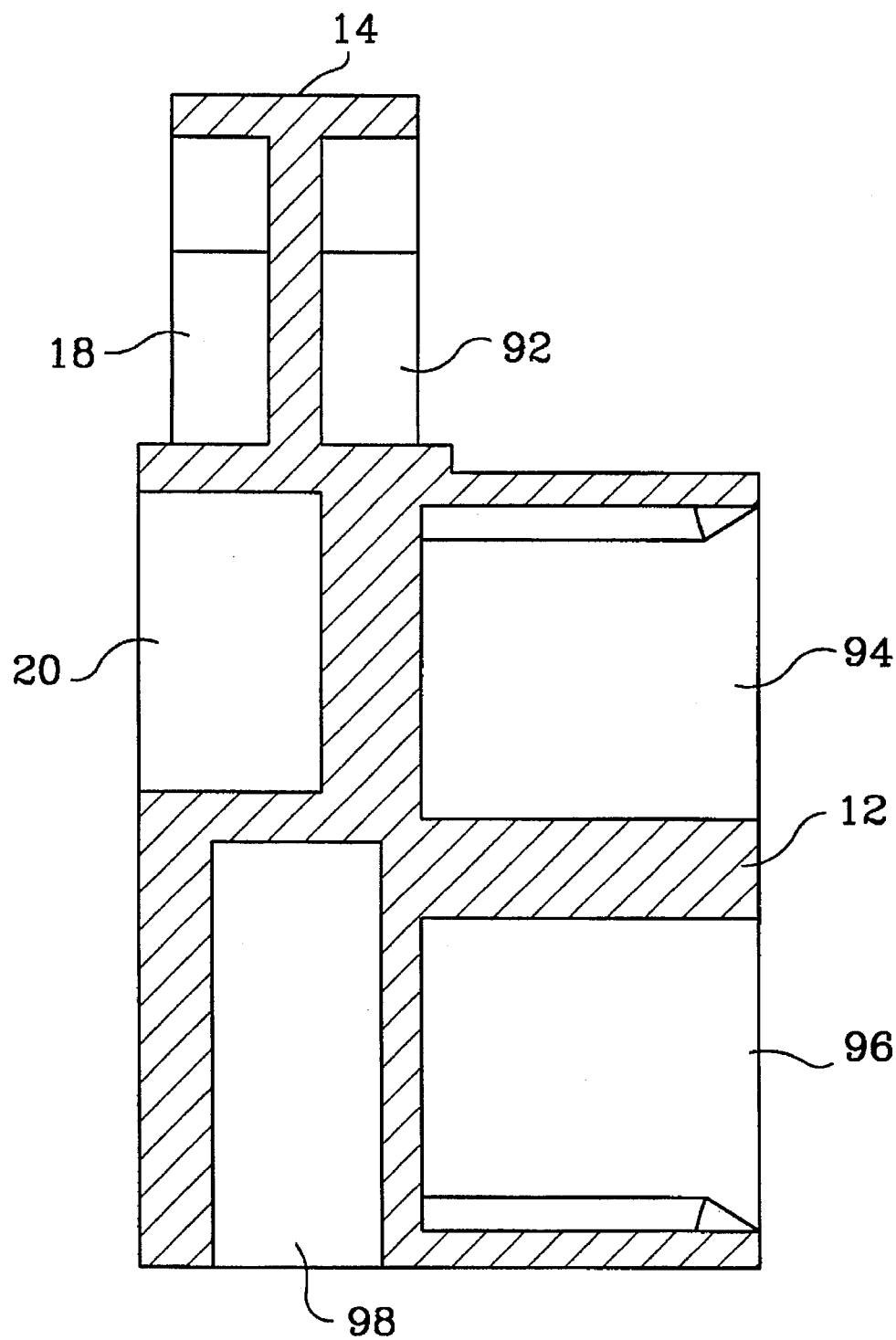
FIG. 1C is a section view of an actuator used in a switch made in accordance with the present invention.

FIG. 1C shows a section view of the actuator 12. As described above, the cavities identified by reference numerals 18 and 20 are provided to reduce the mass of the actuator. In addition, the cavity identified by reference numeral 92 is provided for the same purpose. The two cavities identified by reference numerals 94 and 96 are shaped to receive the first and second magnets, 22 and 24, described above in conjunction with FIG. 1A. The cavity identified by reference numeral 98 in FIG. 1C is provided to receive a coil spring that pushes against a bottom portion of the housing structure 10 in order to return the actuator 12 to a rest position such as that shown in FIG. 1B. Cavities 94 and 96 dispose the first and second magnets, 22 and 24, at a position that is movable relative to the Hall effect element 30. In a preferred embodiment of the present invention, the first and second magnets are disposed in their respective cavities, 94 and 96, in a configuration that exposes opposite magnetic poles to the Hall effect element 30. This configuration creates a magnetic field passing from the north pole of one magnet to the south pole of the other magnet so that the magnetic field can extend through the Hall effect element 30 as the actuator 12 moves up and down relative to the housing structure 10 in FIG. 1B.

Figure 2:
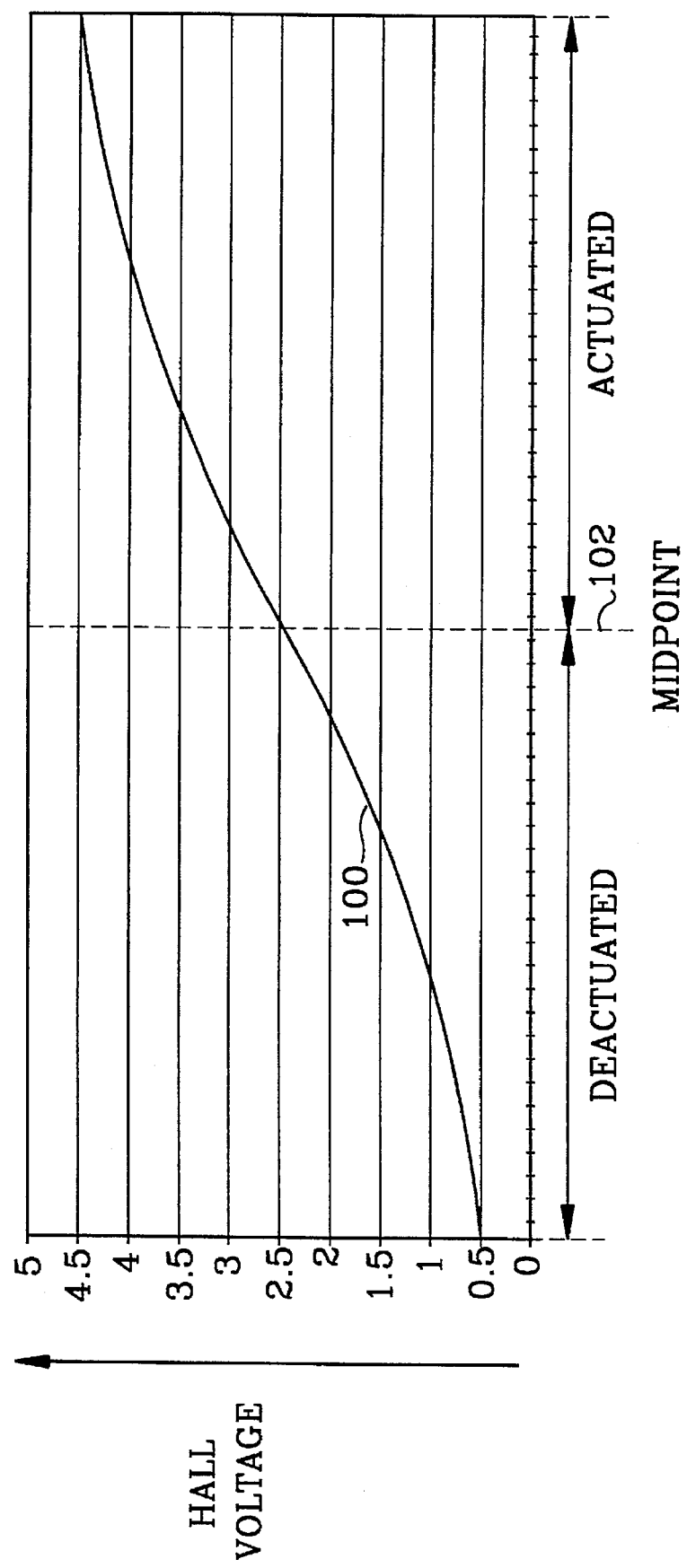
FIG. 2 shows the relationship between the actuator position and an analog output signal from the Hall element.

FIG. 2 shows the analog output voltage 100 as a function of the position of the actuator 12 relative to the Hall effect element 30. Although not represented as a straight line in FIG. 2, the analog output signal 100 is generally linear in the region of the midpoint 102 of travel of the actuator 12. The midpoint 102 can be arbitrarily selected and used as a reference against which the magnitude of the Hall voltage can be compared. For example, if the Hall output voltage has a range from 0 volts to 5 volts, an analog output from the Hall element that is less than 2.5 volts can be used to represent an actuator position that is deactuated, indicating that the plunger of the switch is not depressed sufficiently for the microprocessor to determine that the switch has been actuated. If the Hall output voltage exceeds the arbitrary value of 2.5 volts, the microprocessor can determine that the switch is actuated. Although 2.5 volts is illustrated in FIG. 2 as representing the midpoint of travel of the actuator, it should be clearly understood that other magnitudes can be used as this reference midpoint. The purpose of FIG. 2 is to illustrate that the Hall effect element can provide an analog output signal that is representative of the physical position of the actuator relative to the housing structure. This is possible because the position of the actuator relative to the housing structure is analogous to the position of the magnet structure relative to the Hall effect element. This relationship allows the microprocessor of the present invention to monitor the position of the actuator by monitoring the analog output signal from the Hall effect element. This monitoring can be accomplished either by assuming that the relationship shown in FIG. 2 is linear or, alternatively, by using a lookup table that converts the slightly nonlinear Hall output voltage to a linear dimension along the path which the actuator can move. It should be understood that the shape of curve 100 can be inverted by reversing the polarity of magnets 22 and 24. The convention used in FIG. 2 has been chosen for purposes of providing a clear and consistent description of the present invention.

Figure 3:
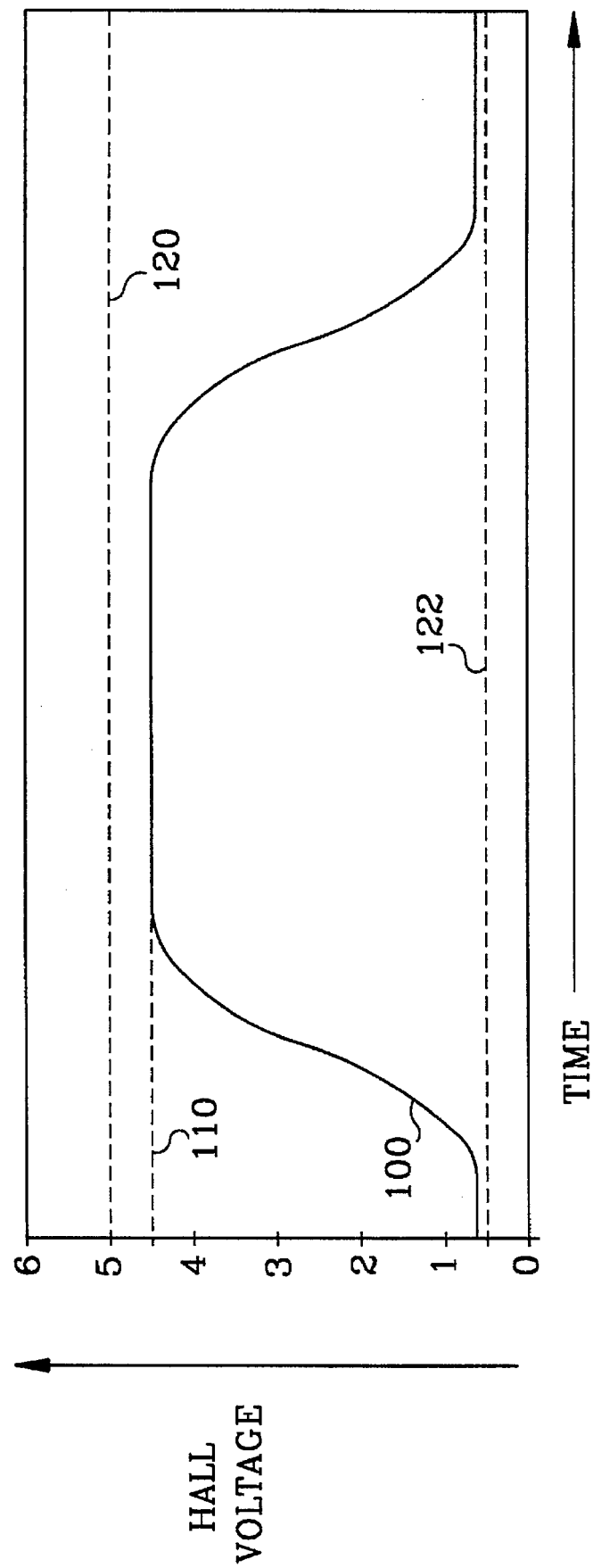
FIG. 3 shows a sequential change in the Hall voltage as a result of the movement of a switch actuator over a preselected period of time.

FIG. 3 represents a hypothetical change in the Hall output voltage 100, as a function of time, as the actuator 12 is depressed by an external force and then released. At the beginning of the time segment shown in FIG. 3, the analog output signal is approximately 0.5 volts and this represents a condition where the actuator is in its rest position and not affected by an external force. Because of the provision of a spring within the cylindrical opening 98 of the actuator, the actuator is at its rest position as shown in FIG. 1B. When the actuator 12 is pushed into the housing structure 10, the Hall output voltage 100 rises and eventually achieves a magnitude of approximately 4.5 volts when it is completely depressed by the external force. This magnitude is represented by dashed line 110. The analog output voltage from the Hall effect element maintains this magnitude until the external force is released. As the external force is released and the spring returns the actuator to its rest position, the analog output voltage from the Hall effect element decreases to approximately 0.5 volts to indicate that the actuator is again at its rest position. The Hall voltage pattern shown in FIG. 3 as a function of time will continue to repeat each time an external force depresses the actuator 12 if the switch is operating properly.

With continued reference to FIG. 3, the microprocessor can be configured to continually monitor the magnitude of the Hall voltage to determine if any failure has occurred within the circuitry of the switch. For example, if the Hall output voltage is expected to be maintained within the operating limits of 0.5 volts and 4.5 volts as shown in FIG. 3, the microprocessor can compare the output voltage from the Hall effect element to certain limits that will detect if this range is exceeded. For example, if the Hall output voltage exceeds 5 volts as represented by dashed line 120 an alarm condition can be signified. In addition, if the Hall output voltage is ever reduced to a magnitude below 0.25 volts, as represented by dashed line 122, an alarm condition can be signified. The absolute magnitude of dashed lines 120 and 122 can be selected to be appropriate for any specific application of a switch and are not limited to the magnitudes described above. Dashed lines 120 and 122 are used to illustrate the fact that the microprocessor can continually monitor the magnitude of the analog output signal 100 from the Hall effect element in order to diagnose the operation of the Hall effect element and its related circuitry. If any of the electrical connections becomes opened, the analog output signal might decrease to a value below dashed line 122. Alternatively, other types of failures might cause the Hall output voltage to exceed dashed line 120 and this could also represent a fault condition.

Figure 4:
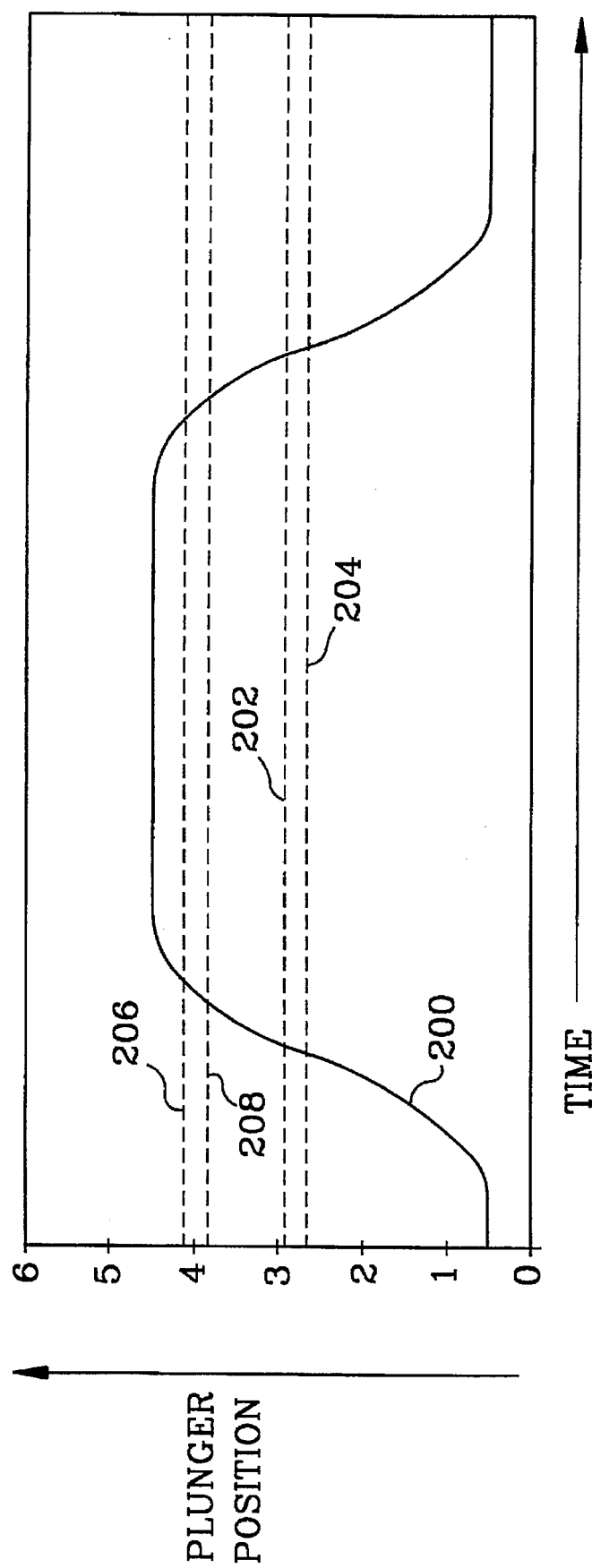
FIG. 4 shows the sequential movement of a plunger as a function of time.

FIG. 4 represents the change in plunger position 200 as a function of time. By comparing FIGS. 3 and 4, it can be seen that the shape of the curve 200 in FIG. 4 is similar to the shape of the cure 100 in FIG. 3. In FIG. 3, the Hall output voltage is represented as a function of time. In FIG. 4, the plunger position is represented as a function of time. Although curves 100 and 200 can be generally identical to each other if the relationship described above in conjunction with FIG. 3 is perfectly linear, this relationship between plunger position and Hall output voltage is not always linear and curves 100 and 200 may therefore differ slightly from each other. This could occur if a nonlinear relationship in FIG. 2 is corrected by the use of a lookup table or other mathematical transformation to calculate the plunger position as a function of the Hall output voltage.

By monitoring the plunger position, as shown in FIG. 4, the microprocessor of the present invention can compare the plunger position to preselected reference values. For example, dashed line 202 can represent a value that is used to determine the chosen operating point of the switch. If the plunger position exceeds the operating point 202, a binary output can be provided from the microprocessor to external devices that indicates that the switch is actuated. If the plunger position is less than dashed line 202, the binary output signal can represent the fact that the switch is deactuated. Slightly below dashed line 202 is another dashed line 204 that defines a hysteresis magnitude of movement of the plunger or actuator. As will be described in greater detail below, this hysteresis magnitude is used to avoid rapid changes in the binary output from the microprocessor if the plunger remains in a position very close to dashed line 202. This type of rapid signal change, or chatter, is avoided by using a hysteresis magnitude such as that defined between dashed lines 202 and 204. Similarly, dashed line 206 can represent an overtravel position of the plunger. In order to provide a hysteresis magnitude for this comparison of dashed line 206 to the plunger position 200, the magnitude represented by dashed line 208 is used. The difference between dashed lines 206 and 208 provides the required hysteresis as will be described in greater detail below. In many applications of a limit switch, it is helpful to determine whether or not a plunger has reached a proper overtravel position after exceeding its operating point. If, for example, the plunger is depressed by a sufficient amount to exceed the operating point 202, but does not exceed the overtravel point 206, it might indicate that the associated equipment on which the switch is mounted is not functioning as expected. For example, a movable component of a machine might not be traveling to an expected position even though it exceeds the position required to provide a binary output signal from the switch that signifies that the component passed the operating point 202. This type of diagnosis is helpful in predicting a potential failure before it actually occurs.

Figure 5:
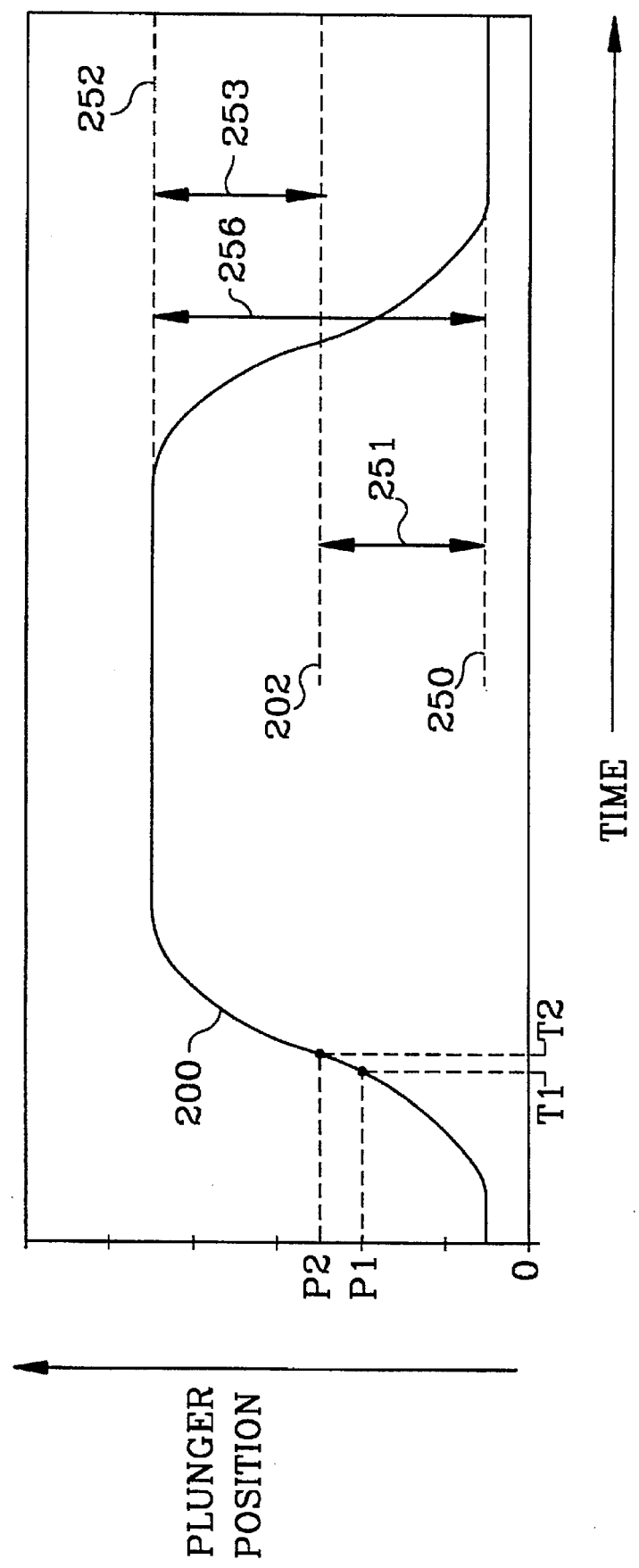
FIG. 5 is similar to FIG. 4, but shows how various parameters can be monitored with regard to the movement of a switch plunger.

The curve 200 in FIG. 5 is identical to the curve 200 in FIG. 4. The purpose of FIG. 5 is to permit additional dimensions to be identified with regard to the changes in magnitude of the plunger position. During operation of the switch, the minimum travel 250, or rest position, of the plunger can be compared to the operating point 202. This dimension is identified by reference numeral 251 in FIG. 5. In addition, the maximum plunger travel 252 can be compared to the operating point 202. This dimension is represented by arrow 253. The microprocessor can also compare the minimum position 250 to the maximum position 252. This dimension is identified by reference numeral 256. By continually monitoring the magnitudes of dimensions 251, 253 and 256, the microprocessor can diagnose the operation of the switch. If, for example, the magnitude of dimension 253 gradually decreases over time, a potential fault condition can be predicted in advance. This condition could indicate that a movable component on a machine which is monitored by the switch is slowly reducing its overall travel even though it continues to cause the switch to provide a binary output signal because the operate point 202 is properly being exceeded. In addition, a gradual decrease in dimension 251 can indicate that the return spring of the actuator is not returning the actuator to its proper rest position following subsequent actuations of the switch. This could be caused by a weakening of the spring or, alternatively, by a build up of debris on the switch that prevents it from returning properly to its rest position. Therefore, it can be seen that the microprocessor of the present invention can monitor the operation of the switch by continually observing the magnitudes of the dimensions identified by reference numerals 251, 253 and 256 in FIG. 5.

Another function that can be performed by the microprocessor of the present invention is the calculation of the velocity of the plunger as it changes from a deactuated position to an actuated position. For example, if the plunger position P1 is determined at time T1 and a subsequent plunger position P2 is determined at a subsequent time T2, the velocity of the plunger can be calculated for the period of time between time T1 to time T2. In a preferred embodiment of the present invention, the position of the plunger is monitored at 10 millisecond intervals. Although the time intervals shown in FIG. 5 are exaggerated for the purpose of clarity of illustration, it should be understood that many position readings can be taken during the period of time when the plunger is moving from a completely deactuated position to a completely actuated position. Although the velocity calculation represented in FIG. 5 is shown at a portion of the curve 200 that indicates that the plunger is being depressed, it should be understood that this velocity calculation could also be performed during the portion of the curve 200 where the plunger is being returned to its rest position. In fact, the importance of the velocity calculation is often more significant during the return portion of the plunger travel because that portion of its travel represents the most likely occurrence of a deleterious change in plunger velocity. In other words, as the plunger is being depressed by an external force, its movement is predominantly determined by the movement of an external object. However, when the plunger returns from a depressed position to its rest position, its return movement is being predominantly determined by the internal operation of the switch as the spring exerts its force against the actuator and attempts to move it back to its rest position. If a failure occurs with regard to the operation of the spring against the bottom portion of the actuator, this potential fault condition can readily be diagnosed by observing a change in the velocity in the plunger's return to its rest position 250.

Figure 6:
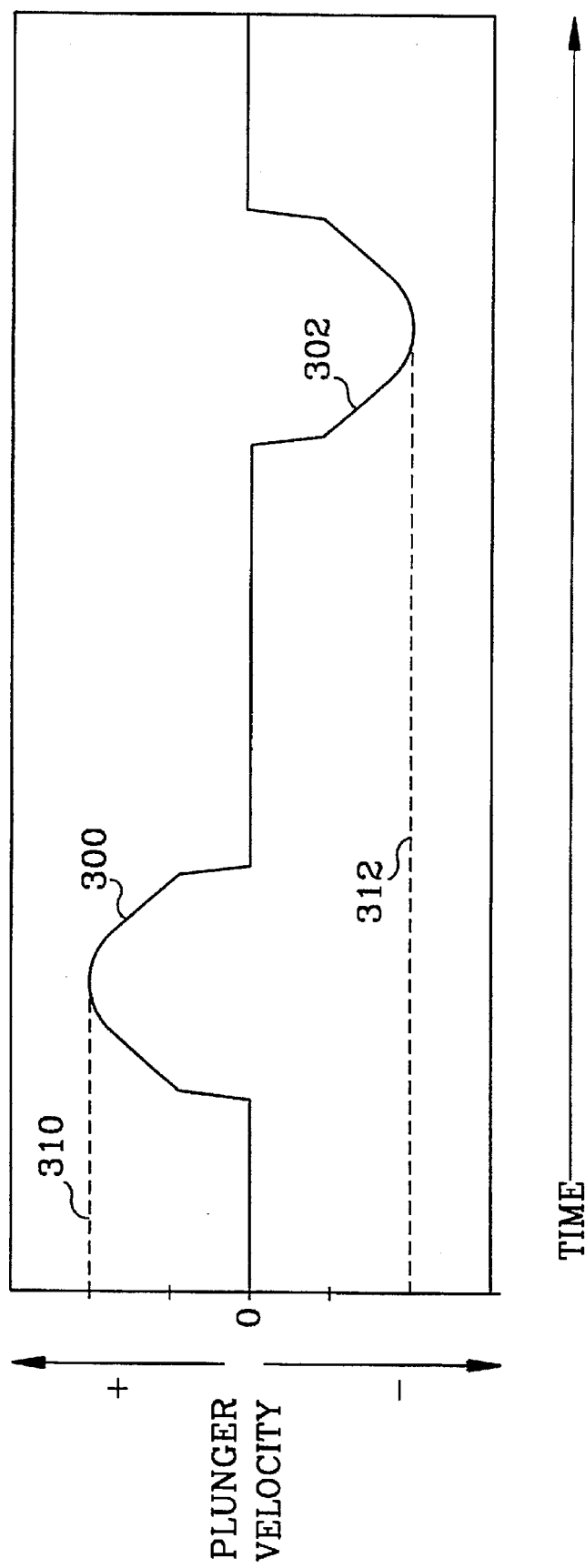
FIG. 6 is a graphical representation of the change in plunger velocity as a function of time in response to an actuation and deactuation of a switch.

FIG. 6 illustrates the velocity of the plunger, as a function of time, in relation to the change in plunger position illustrated in FIG. 5. It should be understood that the shape of the velocity curve in FIG. 6 is the result of a computer simulation and, therefore, the shape of this curve can change significantly from one application of the present invention to another. In FIG. 6, the velocity is initially shown to be changing to values greater than zero as represented by the portion of the curve identified by reference numeral 300. This occurs during the period of time in FIG. 5 where the plunger position moves from its rest position 250 to its fully actuated position 252. The portion of the velocity curve identified by reference numeral 302 represents the velocity, as a function of time, during the later period of time when the plunger returns from its fully actuated position to its rest position. Although the portion of the curve identified by reference numeral 300 represents a positive velocity and the portion of the curve represented by reference numeral 302 represents a negative velocity, it should be understood that a preferred embodiment of the present invention considers only the absolute magnitudes of the velocity calculations.

The velocity curve in FIG. 6 is represented as having both positive and negative values for the purpose of clarity of this description and not as a requirement in all embodiments of the present invention. Dashed line 310 represents the maximum positive velocity attained by the plunger during its change in position from a rest position to a fully actuated position in FIG. 5. Dashed line 312 represents the maximum negative velocity achieved by the plunger during its return from its fully actuated position to its rest position in FIG. 5. As described above, the portion of the curve identified by reference numeral 302 in FIG. 6 is often more important than the portion of the curve represented by reference numeral 300 in FIG. 6. The return of the plunger from its fully actuated position to its rest position is often more critical to the proper operation of a switch than its velocity during the depression of the plunger in response to an external force. The microprocessor can continually monitor the maximum absolute velocities achieved by the plunger during normal operation and observe any decrease in this velocity, especially during the return of the plunger to its rest position. A decrease in the velocity can be used advantageously to predict a potential future fault condition if the velocity continues to decrease. As described above, a preferred embodiment of the present invention considers only the absolute magnitudes of the velocity calculations and not the algebraic magnitudes.

Figure 7:
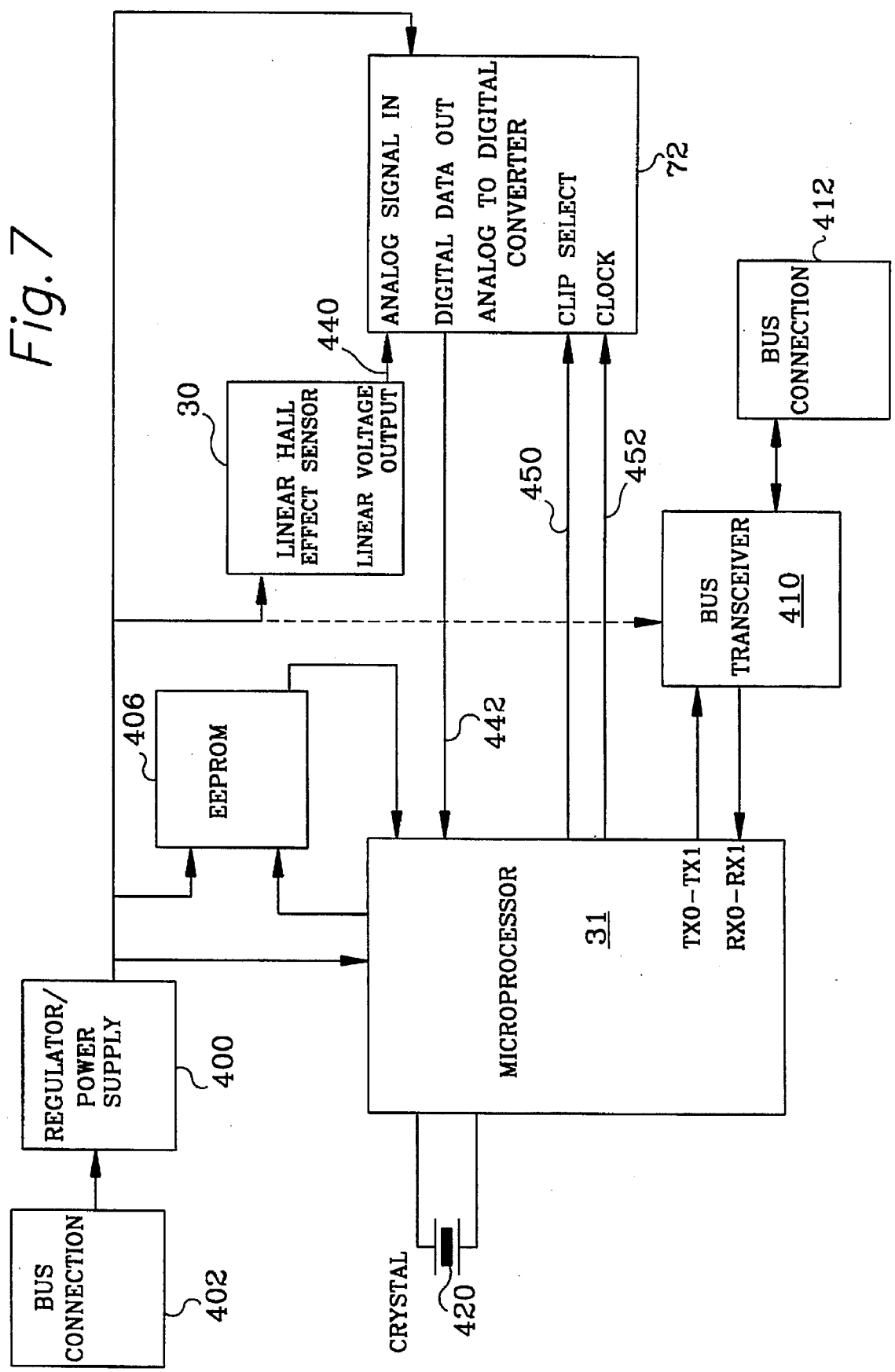
FIG. 7 is a simplified electrical schematic of the present invention.

FIG. 7 represents a simplified electrical schematic of the present invention. A microprocessor 31 is provided with regulated power by a power supply 400 which can receive electrical power from a bus connection 402. Although the bus connection 402 can connect the present invention to of many different bus types, one particularly preferred embodiment of the present invention connects the switch to a Smart Distributed System which is available in commercial quantities from the MICRO SWITCH Division of Honeywell Incorporated. The regulator 400 provides electrical power to the microprocessor 31, an electrically erasable programmable read-only-memory (EEPROM) 406, a transceiver 410, the Hall sensor 30 and the analog-to-digital converter 72. The bus transceiver 410 is connected to the microprocessor 31 and provides the appropriate communication protocol to the bus connection 412. If the bus, such as the Smart Distributed System available from Honeywell Incorporated, is provided with both power and signal conductors, the bus connection 402 is connected to the power conductors and the bus connection 412 is connected to the signal conductors. A crystal oscillator 420 is associated with the microprocessor 31 to provide a clock signal. This clock signal is used by the microprocessor 31 for many time keeping purposes, including the calculation of the plunger velocity as described above. During operation of the present invention, the linear Hall effect sensor 30 provides an analog output signal 440 to the analog-to-digital converter 72. The analog-to-digital converter 72 then provides a digital signal to the microprocessor so that the microprocessor 31 can make the calculations described above. The microprocessor is also connected, by lines 450 and 452, to a chip select input and clock input of the analog-to-digital converter 72. The microprocessor utilizes the EEPROM 406 in a manner that is generally known to those skilled in the art for storing information received and calculated during the operation of the microprocessor.

Figure 8A:
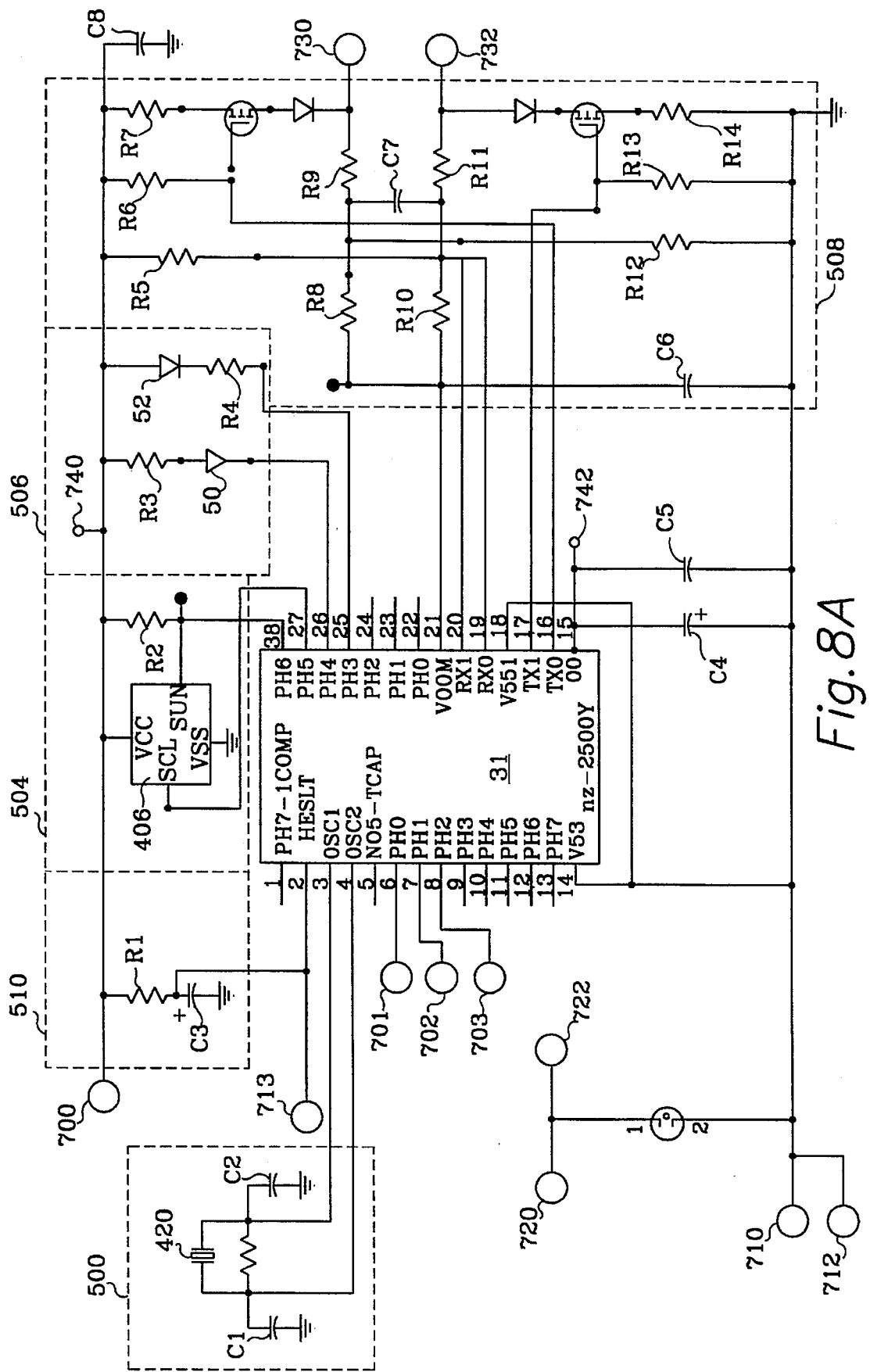
FIGS. 8A and 8B are detailed electrical schematics of the present invention.

FIG. 8A is an electrical schematic of the circuitry contained on the upper circuit board 34 shown in FIGS. 1A and 1B. Dashed boxes in FIG. 8A are provided for the purpose of comparing the components in FIG. 8A to the simplified schematic diagram of FIG. 7. In FIG. 8A, dashed box 500 shows the association of the crystal oscillator 420 with capacitors C1 and C2 and the resistor connected between them to provide clock pulses to the microprocessor 31. The resistor R1 and capacitor C3 in dashed box 501 provide an appropriate timing delay during start up procedures or reset procedures. The EEPROM 406 and resistor R2 are associated together as shown in FIG. 8 by dashed box 504. In dashed box 506, light emitting diode LED 50 and light emitting diode LED 52 are associated with resistors R3 and R4 to provide signals that indicate the actuation of the switch and a fault condition, respectively. LED 50 is an amber LED used to signify the actuation of the switch and LED 52 is a red LED used to indicate a fault condition. Dashed box 508 contains the components used to provide the bus transceiver 410 shown in FIG. 7.

Figure 8B:
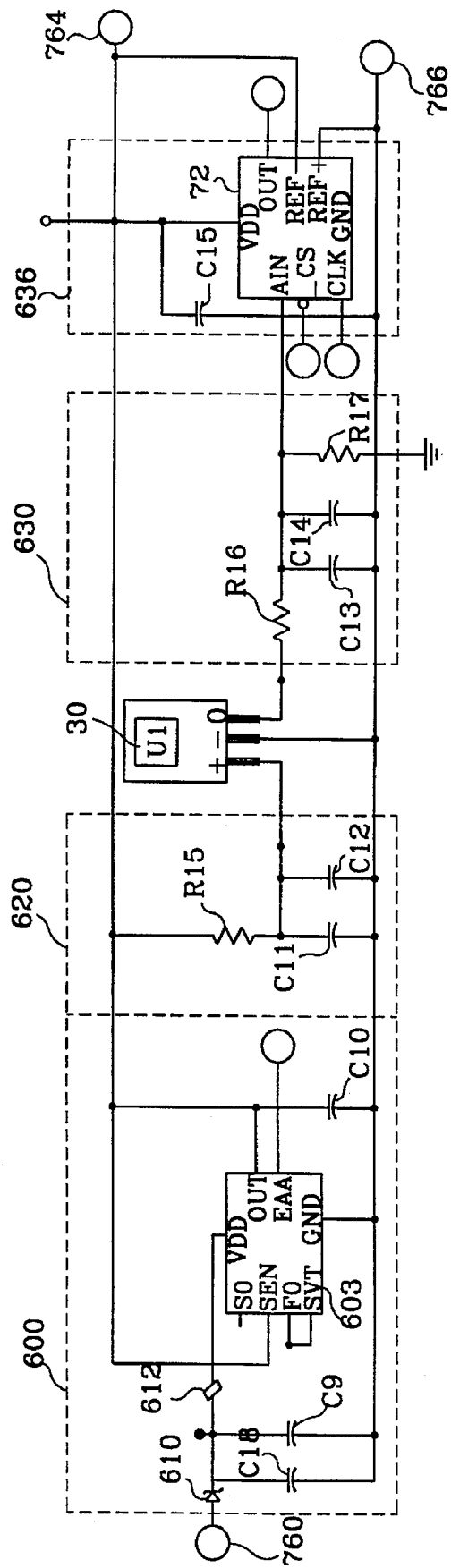

FIG. 8B shows the lower circuit board 32 that is described above in conjunction with FIG. 1A. Dashed box 600 contains the components that comprise the voltage regulator 400 shown in FIG. 7. A regulator 602 is associated with capacitors C8, C9 and C10 in conjunction with a Zener diode 610 and a ferrite bead 612 to provide a supply of regulated power to the other components of the switch shown in FIG. 1A. Dashed box 620 contains the supply filter components R15, C11 and C12. The Hall effect element 20 is illustrated in FIG. 8B between dashed box 620 and dashed box 630. Dashed box 630 contains the components used to provide analog signal filtering between the Hall effect sensor 30 and the analog-to-digital converter 72. Dashed box 636 contains the analog-to-digital converter 72 and a capacitor C15. Since the components of the present invention are contained on two circuit boards, a means is provided to interconnect the two circuit boards. Two interconnect blocks, 40 and 42, are attached to the lower circuit board 32 and are electrically connected to conductive runs on the upper circuit board 34. As can be seen in FIG. 1A, interconnect block 40 contains four conductors and interconnect block 42 contains three conductors. With reference to FIG. 8A, connection point 700 is a pin of interconnect block 40 through which a regulated voltage is connected between the upper and lower circuit boards. In addition, circuit points 701, 702 and 703 are the three pins of interconnect block 42 on the lower circuit board 32.

In FIG. 1A, connector 76 provides the interconnection between the present invention and an external device. Circuit point 710 in FIG. 8A is connected to a pin in connector 76. Power is provided to the device by the external source through a pin in connector 76 that is connected in electrical communication with circuit point 720. Circuit point 722 is connected to one of the pins of interconnect block 40. Output signals from the present invention are connected to an external device through circuit points 730 and 732 which are pins in the connector 76 shown in FIG. 1A. Circuit points 740 and 742 in FIG. 8A are connected to a regulated voltage. Circuit point 713 is connected to interconnect block 40 to provide connection between the microprocessor 31 and connector 76.

In FIG. 8B, circuit point 760 is connected to one of the pins of interconnect block 40 to provide unregulated power to the lower circuit board 32. Regulated power is provided from the lower circuit board 32 to the upper circuit board 34 through circuit point 764 which is connected in electrical communication with one of the pins of interconnect block 40. A ground connection is provided at circuit point 766 which is connected in electrical communication with one of the pins of interconnect block 40. Circuit point 712 in FIG. 8A provides a ground connection to the lower circuit board 32, through interconnect block 40, to circuit point 766 in FIG. 8B. The values of the components shown in the electrical schematics illustrated in FIGS. 8A and 8B are shown in Table I.

TABLE I

| Reference | Magnitude or Identifier |
| --- | --- |
| C1 | 18 pF |
| C2 | 18 pF |
| C3 | 1.0 μF |
| C4 | 1 μF |
| C5 | 1000 pF |
| C6 | 0.01 μF |
| C7 | 1000 pF |
| C8 | 4.7 μF |
| C9 | 4.7 μF |
| C10 | 1.5 μF |
| C11 | 0.01 μF |
| C12 | 1.5 μF |
| C13 | 0.01 μF |
| C14 | 1.5 μF |
| C15 | 0.01 μF |
| C18 | 0.01 μF |
| R1 | 100 kΩ |
| R2 | 10 kΩ |
| R3 | 1 kΩ |
| R4 | 470Ω |
| R5 | 182 kΩ |
| R6 | 10 kΩ |
| R7 | 10Ω |
| R8 | 7.5 kΩ |
| R9 | 27 kΩ |
| R10 | 7.5 kΩ |
| R11 | 27 kΩ |
| R12 | 182 kΩ |
| R13 | 10 kΩ |
| R14 | 10Ω |
| R15 | 5.1Ω |
| R16 | 10Ω |
| R17 | 10 kΩ |
| 30 | SS-495A (Honeywell) |
| 31 | MC68HC705X4 (Motorola) |
| 72 | TLC549 (TI) |
| 406 | X24C01 (Xicor) |
| 602 | LP2951 (National Semi Conductor) |

Figure 9:
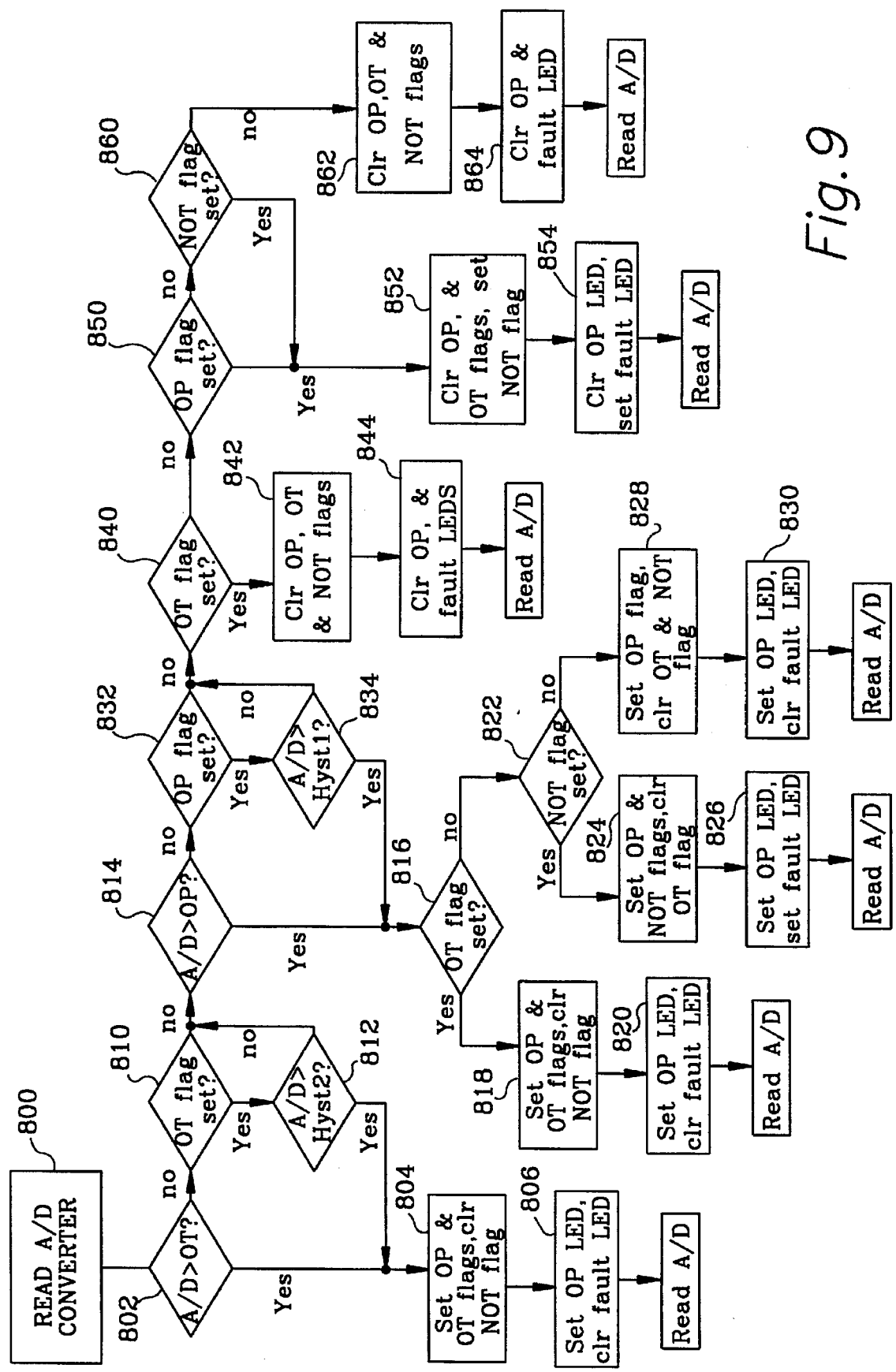
FIG. 9 is a flowchart of the software used in one embodiment of the present invention.

In order to perform all of the functions described above in conjunction with FIGS. 3–6, the microprocessor 31 is provided with appropriate software that performs the algorithms of the present invention. FIG. 9 shows a simplified flowchart that describes the software contained in the microprocessor 31. Function block 800 shows that, upon each execution of the program illustrated in FIG. 9, the analog-to-digital converter 72 is read by the microprocessor 31. The value "A/D" represents the magnitude of the most recent binary representation of the analog output signal from the Hall effect element 30 as it is converted by the analog-to-digital converter 72. Function block 802 compares the Hall output signal to the overtravel value 206 shown in FIG. 4. If the signal exceeds the overtravel value OT, the operate point, or OP, flag and the OT flag are set and the NOT flag is cleared. These three flags, OP, OT and NOT represent conditions that describe the position of the plunger with respect to the lines 202 and 206 shown in FIG. 4. The NOT flag, which will be described in greater detail below, represents a "No Over Travel" condition in which the plunger exceeds the operate point 202, but does not exceed the overtravel point 206. The flags are changed in accordance with function block 804. In addition, the two LED's which are identified by reference numerals 50 and 52 are operated as indicated by function block 806. Following the procedures shown in function blocks 804 and 806, the program returns to function block 800 and again reads the analog-to-digital converter 72. Following this same type of nomenclature described above, the OT flag is interrogated at function block 810 if the Hall voltage does not exceed the overtravel limit 206. Function blocks 810 and 812 are used in combination to assure that the hysteresis magnitude relating to the overtravel limits, 206 and 208 in FIG. 4, are met. As described above, this hysteresis interrogation is performed to avoid chatter when the plunger is in a location where the Hall output voltage is precisely at a magnitude close to dashed line 206 in FIG. 4. The Hall output voltage is compared to the operate point 202 at function block 814, and if the Hall voltage exceeds the operate point 202, the OT flag is interrogated at function block 816. Function blocks 818 and 820 are self explanatory and follow the same nomenclature described above in conjunction with function blocks 804 and 806. At function block 822, the NOT flag is interrogated and the results of this interrogation cause the software to perform the appropriate setting of flags and LED's represented in function blocks 824, 826, 828 and 830.

With continued reference to FIG. 9, function blocks 832 and 834 interrogate the OP flag and the Hall output voltage with respect to dashed line 204 in FIG. 4. In the manner described above in conjunction with function blocks 810 and 812, this logic is performed to assure that a sufficient hysteresis magnitude is employed to avoid chatter when the magnet structure of the actuator is in a position to cause the Hall output voltage to achieve a magnitude approximately equal to the magnitude represented by dashed line 202 in FIG. 4. As described above, this is done to avoid chatter of the binary output signal provided by the microprocessor 31. At function block 840, the OT flag is interrogated and, if it is set, the operate point, OT and NOT flags are cleared. In addition, both light emitting diodes are turned off as represented by function block 844.

At function block 850, the OP flag is checked again and, if it is set, the NOT flag is set. The OP and OT flags are cleared and the fault LED is set as shown in function block 854. The condition that causes the software to execute function block 854 is one in which the operate point 202 is achieved, but the overtravel threshold 206 is not achieved. This indicates that the plunger passed the operate point 202 to cause the microprocessor 31 to provide a logic high binary output signal, but did not move past the overtravel threshold 206. This means that the plunger is being actuated, but not by a sufficient magnitude that achieves the desired overtravel position. In other words, a potential fault condition exists because the plunger is not being sufficiently depressed. The NOT flag is interrogated at function block 860 and, if it is set, function blocks 852 and 854 are performed. If the NOT flag is not set, the OP, OT and NOT flags are cleared. In addition, both LED's are cleared. This is represented by function blocks 862 and 864.

Figure 10:
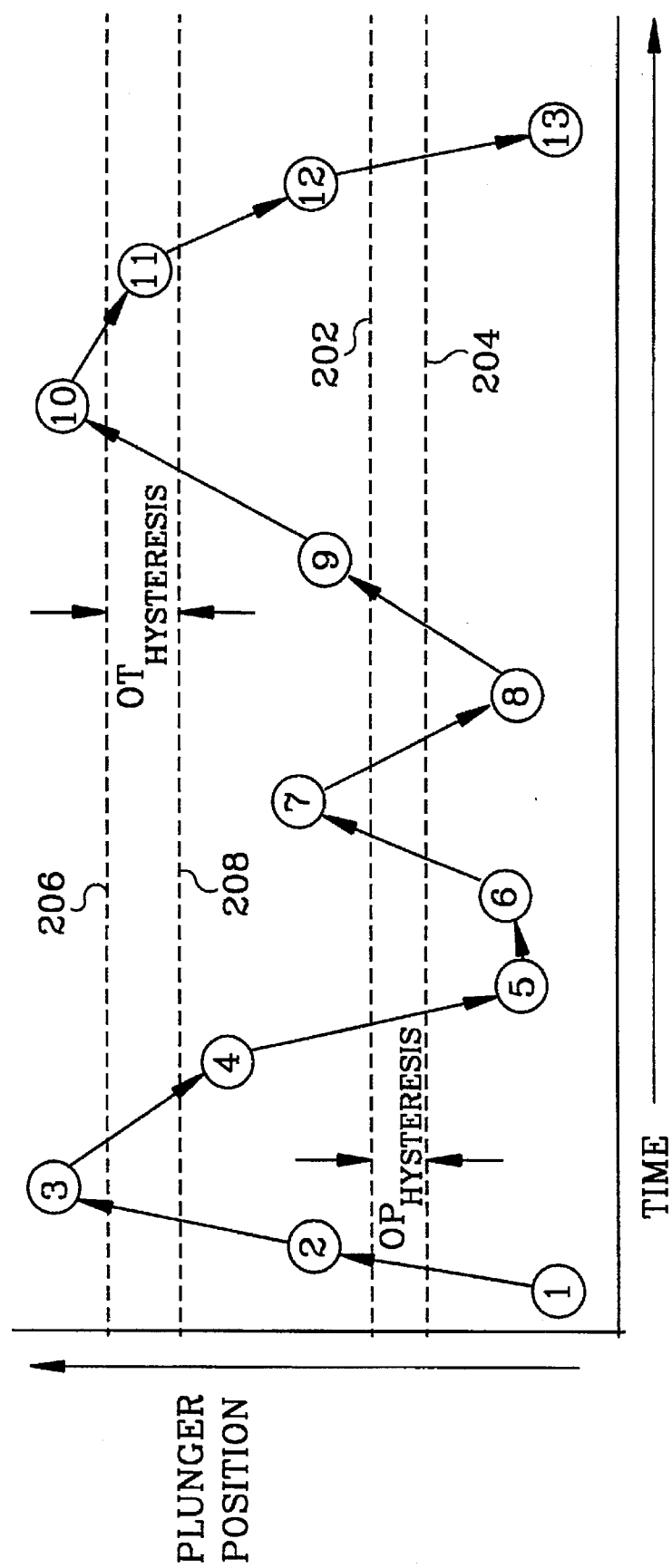
FIG. 10 is a sequential illustration of various plunger positions relating to the logic levels of flags used by the software in one embodiment of the present invention.

In FIG. 9, the software returns to function block 800 upon the completion of each vertical leg in the flow chart as represented by the "READ A/D" function blocks. In order to demonstrate how the software reacts to various positions of the actuator 12, FIG. 10 shows 13 hypothetical positions of the actuator in a timed sequence. The plunger positions in FIG. 10 are identified with reference to dashed lines 202, 204, 206 and 208 which have been described above in conjunction with FIG. 4. Dashed line 202 is a preselected threshold magnitude that represents the desired operate point of the switch. Dashed line 204 is slightly less than the operate point 202 to provide a hysteresis value for the purposes described above. Similarly, dashed line 206 represents a preselected threshold magnitude of plunger travel that is defined as the overtravel position of the actuator. Dashed line 208 represents a magnitude that is slightly less than the desired overtravel position and is used to provide a hysteresis magnitude for the purposes described above. The sequence of positions shown in FIG. 10 is hypothetical and is provided for the purpose of illustrating how the flow chart in FIG. 9 reacts to the movement of the plunger. Table II shows the logic level of the three flags described above in conjunction with FIG. 9 for each of the 13 hypothetical positions shown in FIG. 10. The OP flag, the OT flag and the NOT flag are each shown with a logic level of either 0 or 1 for each of the 13 positions of FIG. 10. It should be clearly understood that the microprocessor 31 of the present invention interrogates the flags and compares the Hall output voltage to the various thresholds at a rate that is much more rapid than that which is indicated by the 13 hypothetical positions in FIG. 10. However, the 13 selected positions in FIG. 10 are sufficiently illustrative to describe the operation of the flow chart in FIG. 9 so that one skilled in the art can see the effectiveness of the software described therein.

TABLE II

|  | 1 | 2 | 3 | 4 | 5 | 6 | 7 | 8 | 9 | 10 | 11 | 12 | 13 |
|---|---|---|---|---|---|---|---|---|---|---|---|---|---|
| OP | 0 | 1 | 1 | 1 | 0 | 0 | 1 | 0 | 1 | 1 | 1 | 1 | 0 |
| OT | 0 | 0 | 1 | 1 | 0 | 0 | 0 | 0 | 0 | 1 | 1 | 1 | 0 |
| NOT | 0 | 0 | 0 | 0 | 0 | 0 | 0 | 1 | 1 | 0 | 0 | 0 | 0 |

With reference to FIGS. 9 and 10 and Table II, position one in FIG. 10 will cause the software to execute function blocks 802, 810, 814, 832, 840, 850, 860, 862 and 864. This will clear all three flags as shown in Table II. When the switch attains position 2 in FIG. 10, the software will execute function blocks 802, 810, 814, 816, 822, 828 and 830. This will cause the OP flag to be set and will cause the OT and NOT flags to be cleared. When the actuator achieves position 3 in FIG. 10, the software will execute function blocks 802, 804 and 806. The OP and OT flags will be set and the NOT flag will be cleared. As the external force is released from the plunger and the spring causes the plunger to return to its rest position, it will move to position 4 in FIG. 10. This will cause the software to execute function blocks 802, 810, 812, 814, 816, 818 and 820. The OP and OT flags will remain set and the NOT flag will remain cleared. Eventually, the actuator will move back to position 5 in FIG. 10 and the software will execute function blocks 802, 810, 812, 814, 832, 834, 840, 842 and 844. All of the flags are cleared. This indicates that the switch is operating as intended and has properly returned to its rest position. The software will repeat the same functions when the actuator remains at its rest position as indicated by position 6 in FIG. 10. Upon the exertion of the external force on the actuator, it again moves away from its rest position as indicated at position 7 of FIG. 10. The software will execute the same function blocks that it did when the switch was in position 2 in FIG. 10. This will cause the OP flag to be set. The OT flag and the NOT flag will be cleared.

When the actuator moves from position 6 to position 7 in FIG. 10, it appears to be operating properly. However, instead of proceeding to a position beyond the overtravel threshold 206, it returns from position 7 to its rest position 8 as shown in FIG. 10. This causes the software to execute function blocks 802, 810, 814, 832, 834, 840, 850, 852 and 854 which clears the OP and OT flags, but sets the NOT flag. The NOT flag indicates that the actuator has returned from position 7 above the operate point threshold 202 to the rest position without exceeding the overtravel threshold 206. As a result, the fault LED is activated at function block 854 to indicate that a fault condition exists. The diagnostic capability of the software recognizes that the movement from position 6 to position 7 and then to position 8, in sequence, is improper because the actuator of the switch was not fully depressed as expected.

Following the move to position 8 in FIG. 10, the chronological graph indicates that a subsequent actuation of the switch causes the actuator to move to position 9. This causes the software to execute function blocks 802, 810, 814, 816, 822, 824 and 826. As shown in Table II, this sets the OP flag, but leaves the NOT flag set to indicate that a fault has previously occurred. At this point, the microprocessor does not know whether the plunger will proceed to a proper position 10 or repeat the movement indicated by positions 6, 7 and 8 in FIG. 10. When the actuator moves from position 9 to position 10 in FIG. 10, the software executes function blocks 802, 804 and 806. The movement from position 8 to position 9 and then to position 10 represents a proper sequence of the plunger. This causes the OP flag and the OT flag to be set and clears the NOT flag and the related fault LED. Following its movement to position 10, the actuator moves to position 11 which is between the overtravel threshold 206 and its related hysteresis threshold 208. This causes the software to execute function block 802, 810, 812, 804 and 806. The OP and OT flags remain set and the NOT flag remains cleared. As the actuator proceeds to position 12, the software executes function blocks 802, 810, 812, 814, 816, 818 and 820. This leaves the OP and OT flags set and leaves the NOT flag cleared. Eventually, when the actuator moves to position 13, the software will perform function blocks 802, 810, 812, 814, 832, 834, 840, 842 and 844 as it did when the plunger returned to position 5 after achieving position 4. Although not shown specifically in FIG. 10, if the actuator had moved to a position between the operate point 202 and its related hysteresis magnitude 204, the software would have executed function blocks 802, 810, 812, 814, 832, 834, 816, 818 and 820.

The sequential movement of the plunger, as represented in FIG. 10, causes the software to execute the program represented by the flowchart in FIG. 9 and results in the OP, OT and NOT flags attaining the logic values shown in Table II. The software represented by the flowchart in FIG. 9 monitors the movement of the plunger and assures that the switch is operating properly. The other functions described above in conjunction with FIGS. 2–6 are not specifically illustrated in the flowchart of FIG. 9 which is intended to show the monitoring of the plunger movement with respect to the thresholds and hysteresis values. However, it should be understood by those skilled in the art that the comparison of the Hall voltage 100 to the values represented by dashed lines 122 and 120 in FIG. 3 is easily performed by a microprocessor that is provided with a digital value representing the Hall voltage. In addition, the calculation of the velocity of the plunger, as described above in conjunction with FIG. 5, requires only that the microprocessor 31 repeatedly compare sequential plunger positions, P1 and P2, which are taken at sequential times, T1 and T2, so that the velocity can be calculated. In addition, the comparison of the maximum travel 252 and minimum travel 250 to the operate point 202, as shown in FIG. 5, can be readily performed by the microprocessor 31. In addition, the comparison of the maximum velocities achieved by the plunger, as illustrated in FIG. 6, is also within the capability of the microprocessor 36 when provided with appropriate software. These software routines are not shown in flowchart form because they have been described in detail above in conjunction with the Figures.

With regard to FIGS. 2–6, the Hall voltage is illustrated as increasing when the actuator is depressed by an external force. However, it should be clearly understood that the reverse could be true if the polarities of the first and second magnets 22 and 24 are reversed. Certain embodiments of the present invention employ the reversed polarity of the magnets. When this option is chosen, the comparisons represented in the flow chart of FIG. 9 must also be reversed. In other words, rather than determining if the Hall voltage is greater than a preselected threshold, the software would determine if the Hall voltage is less than the predetermined threshold and vice versa. The relationship between the Hall voltage and the actuator position represented in FIGS. 2-6 was chosen to simplify the explanation of the present invention by representing increased depression of the actuator with an increased voltage magnitude from the Hall element. However this relationship could be reversed with the same beneficial results described above.

Although the present invention has been described with specificity and illustrated to show a particularly preferred embodiment of the present invention, alternative embodiments are also within its scope. For example, the Hall effect element could be replaced by a magnetoresistive element. In addition, the first and second magnets could be replaced by a magnet with an appropriate pole piece structure to achieve the same results described above. Furthermore, the switch structure of the present invention could be combined with many different types of switches other than limit switches.

The embodiments of the invention in which an exclusive property or right is claimed are defined as follows:

1. A switch, comprising:
a housing structure;
an actuator which is movable relative to said housing structure in response to an external force exerted upon it;
a magnet structure attached to said actuator, said magnet structure being movable along a path within said housing structure in response to movement of said actuator;
a magnetically sensitive component attached to said housing structure and disposed proximate said path, said magnetically sensitive component having an analog output signal which is representative of the position of said magnet structure along said path;
means, connected in signal communication with said magnetically sensitive component, for determining the position of said actuator relative to said housing structure as a function of said analog output signal;
means, connected in signal communication with said magnetically sensitive component, for determining the magnitude of movement of said actuator relative to a predetermined position; and
means for calculating the velocity of said actuator when said magnet structure moves along said path.

2. The switch of claim 1, further comprising:
means for providing a binary output signal which is representative of said position of said actuator relative to said housing structure.

3. The switch of claim 1, further comprising:
means for counting the number of actuations of said actuator in response to said external force.

4. The switch of claim 1, further comprising:
means for comparing said analog output signal from said magnetically sensitive component to a predetermined range of magnitudes to determine the proper operation of said switch.

5. The switch of claim 1, wherein:
said magnetically sensitive component comprises a Hall effect element.

6. The switch of claim 1, wherein:
said magnet structure comprises two permanent magnets disposed in abutting association with each other.

7. The switch of claim 6, further comprising:
a ferromagnetic pole piece disposed proximate said two permanent magnets.

8. The switch of claim 1, further comprising:
a microprocessor disposed within said housing structure, said microprocessor providing said means for determining said position of said actuator relative to said housing structure as a function of said analog output signal and said means for determining said magnitude of movement of said actuator relative to said predetermined position.

9. A switch, comprising:
a housing structure;
an actuator which is movable relative to said housing structure in response to an external force exerted upon it;
a magnet structure attached to said actuator, said magnet structure being movable along a path within said housing structure in response to movement of said actuator;
a magnetically sensitive component attached to said housing structure and disposed proximate said path, said magnetically sensitive component having an analog output signal which is representative of the position of said magnet structure along said path;
means, connected in signal communication with said magnetically sensitive component, for determining the position of said actuator relative to said housing structure as a function of said analog output signal;
means, connected in signal communication with said magnetically sensitive component, for determining the magnitude of movement of said actuator relative to a predetermined position; and
means for comparing said analog output signal from said magnetically sensitive component to a predetermined range of magnitudes to determine the proper operation of said switch.

10. The switch of claim 9, further comprising:
means for calculating the velocity of said actuator when said magnet structure moves along said path.

11. The switch of claim 10, further comprising:
means for counting the number of actuations of said actuator in response to said external force.

12. The switch of claim 11, further comprising:
means for providing a binary output signal which is representative of said position of said actuator relative to said housing structure.

13. The switch of claim 9, wherein:
said magnetically sensitive component comprises a Hall effect element.

14. The switch of claim 9, wherein:
said magnet structure comprises two permanent magnets disposed in abutting association with each other.

15. The switch of claim 14, further comprising:
a ferromagnetic pole piece disposed proximate said two permanent magnets.

16. The switch of claim 9, further comprising:
a microprocessor disposed within said housing structure, said microprocessor providing said means for determining said position of said actuator relative to said housing structure as a function of said analog output signal, said means for determining said magnitude of movement of said actuator relative to said predetermined position and said means for providing said binary output signal which is representative of said position of said actuator relative to said housing structure.

17. A switch, comprising:

a housing structure;

an actuator which is movable relative to said housing structure in response to an external force exerted upon it;

a magnet structure attached to said actuator, said magnet structure being movable along a path within said housing structure in response to movement of said actuator;

a magnetically sensitive component attached to said housing structure and disposed proximate said path, said magnetically sensitive component having an analog output signal which is representative of the position of said magnet structure along said path;

means, connected in signal communication with said magnetically sensitive component, for determining the position of said actuator relative to said housing structure as a function of said analog output signal;

means, connected in signal communication with said magnetically sensitive component, for determining the magnitude of movement of said actuator relative to a predetermined position;

means for providing a binary output signal which is representative of said position of said actuator relative to said housing structure;

means for calculating the velocity of said actuator when said magnet structure moves along said path;

means for counting the number of actuations of said actuator in response to said external force;

means for comparing said analog output signal from said magnetically sensitive component to a predetermined range of magnitudes to determine the proper operation of said switch.

18. The switch of claim 17, wherein:

said magnetically sensitive component comprises a Hall effect element and said magnet structure comprises two permanent magnets disposed in abutting association with each other.

19. The switch of claim 17, further comprising:

a microprocessor disposed within said housing structure, said microprocessor providing said means for determining said position of said actuator relative to said housing structure as a function of said analog output signal, said means for determining said magnitude of movement of said actuator relative to said predetermined position, said means for providing said binary output signal which is representative of said position of said actuator relative to said housing structure, said means for calculating the velocity of said actuator when said magnet structure moves along said path, said means for counting the number of actuations of said actuator in response to said external force and said means for comparing said analog output signal from said magnetically sensitive component to a predetermined range of magnitudes to determine the proper operation of said switch.

* * * * *